(12) United States Patent
Hashimoto

(10) Patent No.: US 8,026,024 B2
(45) Date of Patent: Sep. 27, 2011

(54) MASK BLANK AND METHOD FOR MANUFACTURING TRANSFER MASK

(75) Inventor: Masahiro Hashimoto, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 94 days.

(21) Appl. No.: 12/441,319

(22) PCT Filed: Sep. 14, 2007

(86) PCT No.: PCT/JP2007/067932
§ 371 (c)(1),
(2), (4) Date: Mar. 13, 2009

(87) PCT Pub. No.: WO2008/032819
PCT Pub. Date: Mar. 20, 2008

(65) Prior Publication Data
US 2009/0233190 A1    Sep. 17, 2009

(30) Foreign Application Priority Data
Sep. 15, 2006    (JP) .................. 2006-251486

(51) Int. Cl.
*G03F 1/00* (2006.01)
(52) U.S. Cl. ........................................... 430/5
(58) Field of Classification Search ............... 430/5, 30, 430/322, 323, 331
See application file for complete search history.

(56) References Cited

U.S. PATENT DOCUMENTS

| | | | |
|---|---|---|---|
| 7,026,497 B2 * | 4/2006 | Ryu et al. | 556/412 |
| 7,611,825 B2 * | 11/2009 | Chang et al. | 430/311 |
| 2006/0088774 A1 | 4/2006 | Yoshikawa et al. | |
| 2007/0212618 A1 * | 9/2007 | Yoshikawa et al. | 430/5 |
| 2008/0063950 A1 | 3/2008 | Yoshikawa et al. | |

FOREIGN PATENT DOCUMENTS

| | | |
|---|---|---|
| JP | 63-55549 A | 3/1988 |
| JP | 9054421 A | 2/1997 |
| JP | 2000-29227 A | 1/2000 |
| JP | 2001-281878 A | 10/2001 |
| JP | 2006-78807 A | 3/2006 |
| JP | 2006-146152 A | 6/2006 |
| KR | 10-2006-0003150 A | 1/2006 |

OTHER PUBLICATIONS

Korean Office Action corresponding to Korean Patent Application No. 10-2009-7007636, dated Dec. 30, 2010.

* cited by examiner

*Primary Examiner* — Stephen Rosasco
(74) *Attorney, Agent, or Firm* — Sughrue Mion, PLLC

(57) ABSTRACT

To provide a mask blank which can eliminate pattern defects by preventing a resist pattern from disappearing at the time of manufacturing a transfer mask in semiconductor design rule (DRAM hp65 nm or below), and to provide a mask.

A mask blank including a thin film for forming a mask pattern, the thin film being formed on a substrate, and a resist film formed over the thin film, wherein the thin film and the resist film sandwich an adhesion layer that is bonded to the thin film and the resist film, and the adhesion layer prevents, during development of the resist film in patterning of the resist film, collapse of the patterned resist film.

19 Claims, 2 Drawing Sheets

MASK BLANK AND METHOD FOR MANUFACTURING TRANSFER MASK

TECHNICAL FIELD

The present invention relates to mask blanks, transfer masks, and the like that are used for manufacturing semiconductor devices, display devices (display panels), and the like.

BACKGROUND ART

With successive reductions in the size of circuit patterns of semiconductor devices in recent years, there is a demand for mask blanks and masks to be used in photolithography conducted under a semiconductor design rule of a DRAM half pitch (hp) of 65 nm or less.

In general, photolithography for microprocessing semiconductor devices is conducted by reduction projection exposure. Thus, the size of a pattern formed in a mask for transferring the pattern is about four times larger than the size of a pattern to be transferred onto a semiconductor substrate. However, the size of circuit patterns transferred onto semiconductor substrates has been reduced to a size considerably smaller than the wavelength of exposure light in photolithography conducted under the semiconductor design rule (DRAM hp of 65 nm or less). For this reason, when reduction projection exposure is conducted through a transfer mask having a transfer pattern that is formed by simply enlarging a circuit pattern by a factor of about 4, the transfer pattern cannot be accurately transferred to a resist film on a semiconductor substrate due to influences such as interference of exposure light.

To deal with this problem, a super-resolution mask is used. One example of such a super-resolution mask is an OPC (Optical Proximity Effect Correction) mask which utilizes an optical proximity effect correction technique and is used to correct an optical proximity effect that degrades the transfer property of the mask. Another example of such a super-resolution mask is a phase-shifting mask (enhancer mask) having a configuration (mask enhancer) in which a phase shifter is provided in the center portion of a light-shielding pattern having the shape of a line or the like. With this configuration, the light-shielding property of the mask pattern is enhanced to increase the resolution of the line pattern. Such an OPC mask requires formation of an OPC pattern, for example, that has a size equal to or less than half that of a circuit pattern (for example, an assist bar, a hammer head, or the like having a linewidth of less than 100 nm). Such an enhancer mask also requires a light-shielding pattern and a phase shifter that have extremely small linewidths.

Such an enhancer mask has the following characteristic. When the width of a light-shielding pattern and the width of a phase shifter are adjusted such that the intensity of light that reaches the backside of the light-shielding pattern from around the light-shielding pattern is balanced with the intensity of light that passes through the phase shifter, the intensity of the amplitude of light that passes through the mask enhancer has a distribution of 0 at a position corresponding to the center of the mask enhancer, and the intensity (amplitude intensity squared) of light that passes through the mask enhancer also has a distribution of 0 at a position corresponding to the center of the mask enhancer.

DISCLOSURE OF INVENTION

Problems to be Solved by the Invention

However, when a transfer mask for achieving the semiconductor design rule (DRAM hp of 65 nm or less) is manufactured with a mask blank including a high-resolution chemically amplified resist, insufficient adhesion of the resist film causes loss of a resist pattern in a development treatment in a step of forming a patterned resist film and thus a pattern defect is generated.

To overcome this problem, an object of the present invention is to provide a mask blank with which loss of a resist pattern and generation of a pattern defect can be prevented in manufacturing a transfer mask for achieving the semiconductor design rule (DRAM hp of 65 nm or less), and a transfer mask.

Means for Solving the Problems

The present invention includes the following structures.
(Structure 1)
A mask blank comprising a thin film for forming a mask pattern, the thin film being formed on a substrate, and a resist film formed over the thin film,
wherein the thin film and the resist film sandwich an adhesion layer that is bonded to the thin film and the resist film, and the adhesion layer prevents, during development of the resist film in patterning of the resist film, collapse of the patterned resist film.
(Structure 2)
The mask blank according to structure 1, wherein the adhesion layer is a resin film resistant to a developer that is used in the development.
(Structure 3)
The mask blank according to structure 1 or 2, wherein a surface of the adhesion layer is cleaned, the surface being on a side where the resist film is formed.
(Structure 4)
The mask blank according to any one of structures 1 to 3, wherein the adhesion layer is removed by a patterning treatment for the thin film.
(Structure 5)
The mask blank according to any one of structures 1 to 4, wherein the thin film is a metal film.
(Structure 6)
The mask blank according to any one of structures 1 to 5, wherein the thin film is a silicon-containing film that contains silicon.
(Structure 7)
A method for manufacturing a transfer mask comprising patterning the thin film of the mask blank according to any one of structures 1 to 6 to form a transfer pattern on the substrate.
(Structure 8)
A mask blank comprising a resist film on a substrate including a thin film, wherein an intermediate layer for preventing collapse of a resist pattern formed in the resist film exists between the thin film and the resist film.
(Structure 9)
The mask blank according to structure 8, wherein the resist pattern formed in the resist film includes a pattern having a linewidth of less than 100 nm.
(Structure 10)
The mask blank according to structure 8 or 9, wherein the resist pattern formed in the resist film includes a pattern having an aspect ratio of 3 or more.
(Structure 11)
The mask blank according to any one of structures 8 to 10, wherein the intermediate layer is insoluble in a developer for forming the resist pattern in the resist film.

(Structure 12)
The mask blank according to any one of structures 8 to 11, wherein the intermediate layer is patterned when the thin film is patterned with the resist pattern serving as a mask.
(Structure 13)
The mask blank according to any one of structures 8 to 12, wherein the intermediate layer is stripped off when the resist pattern is stripped off from the substrate.
(Structure 14)
The mask blank according to any one of structures 8 to 13, wherein the thin film is a film containing chromium or a film containing silicon.
(Structure 15)
A method for manufacturing a transfer mask, comprising:
preparing a mask blank including a thin film for forming a mask pattern, an intermediate layer for covering the thin film at least in a region where the mask pattern is formed, and a resist pattern formed on the intermediate layer; and
sequentially patterning the intermediate layer and the thin film with the resist pattern serving as a mask.
(Structure 16)
The method for manufacturing a transfer mask according to structure 15,
wherein, after the intermediate layer and the thin film are patterned, the resist pattern and the intermediate layer are sequentially stripped off.

Hereinafter, the present invention will be explained in detail.

According to the present invention, there is provided a mask blank comprising a thin film for forming a mask pattern, the thin film being formed on a substrate, and a resist film formed over the thin film,
wherein the thin film and the resist film sandwich an adhesion layer that is bonded to the thin film and the resist film, and the adhesion layer prevents, during development of the resist film in patterning of the resist film, collapse of the patterned resist film (structure 1).

According to the invention of the structure 1, the thin film for forming a mask pattern and the resist film sandwich an adhesion layer that is bonded to the thin film and the resist film. As a result, even when a transfer mask for achieving a semiconductor design rule (DRAM hp of 65 nm or less) is manufactured, collapse of a patterned resist film can be prevented during development of the resist film in patterning of the resist film. Therefore, the invention can provide a mask blank in which the occurrence of pattern defects caused by the collapse of a resist pattern are prevented.

According to the invention of the structure 2, the adhesion layer is a resin film resistant to a developer that is used in the development. As a result, the adhesion layer exhibits a further enhanced adhesion to the resist film.

According to the invention of the structure 3, a surface of the adhesion layer is cleaned and the surface is on a side where the resist film is formed. As a result, the adhesion layer exhibits a further enhanced adhesion to the resist film. Also, this invention can prevent substances that degrade properties of the resist film from migrating into the resist film from underneath. In particular, when the resist is a chemically amplified resist, this invention can prevent substances that degrade the chemical amplification property of the resist film from migrating into the resist film from underneath. As a result, the pattern accuracy can be enhanced.

Such a mask blank in the present invention may be a photomask blank, a phase-shifting mask blank, a reflection mask blank, or a transfer plate substrate for imprinting. Such a mask blank may also be a mask blank including a resist film or a mask blank before a resist film is formed. Such a mask blank before a resist film is formed may be a mask blank including an adhesion layer according to the present invention on a thin film for forming a mask pattern. Such a phase-shifting mask blank may be a mask blank where a light-shielding film composed of a chromium-based material or the like is formed on a half-tone film. In this case, the thin film for forming a mask pattern refers to the half-tone film and the light-shielding film. Such a reflection mask blank may be a mask blank having a configuration in which an absorber film that is to provide a transfer pattern and is composed of a tantalum-based material or a chromium-based material is formed on a multilayer reflective film or a buffer layer formed on a multilayer reflective film. Such a transfer plate for imprinting may be a transfer plate having a configuration in which a thin film is formed on a substrate serving as the transfer plate and the thin film is composed of a chromium-based material or the like and is used for forming a transfer pattern. A mask may be a photomask, a phase-shifting mask, a reflection mask, or a transfer plate for imprinting. Such a mask may be a reticle.

A thin film for forming a mask pattern in the present invention may be a light-shielding film for shielding exposure light or the like, a semitransparent film for adjusting and controlling the transmittance of exposure light or the like, a reflectivity-controlling film (including an antireflective film) for adjusting and controlling the reflectivity in terms of exposure light or the like, a phase-shifting film for shifting the phase of exposure light or the like, or a half-tone film having a light-shielding property and a phase-shifting property.

When a mask blank according to the present invention is formed so that the adhesion layer is removed by a patterning treatment for the thin film (structure 4), a pattern of a chemically amplified resist film formed on the mask blank can be accurately transferred to the thin film. Specifically, this transfer to the thin film can be conducted while the resolution in the chemically amplified resist film on the mask blank is maintained. The resolution is achieved by the presence of the adhesion layer. As a result, good resolution is provided in a transfer pattern obtained by patterning the thin film and good pattern accuracy is also achieved.

A mask blank according to the present invention is particularly advantageous when the thin film for forming a mask pattern is a metal film (structure 5). Examples of the metal film include films composed of chromium, tantalum, molybdenum, titanium, hafnium, tungsten, alloys containing the foregoing elements, and materials containing the foregoing elements or the foregoing alloys.

A mask blank according to the present invention is particularly advantageous when the thin film for forming a mask pattern is a silicon-containing film that contains silicon (structure 6). Examples of the silicon-containing film include a silicon film, a metal silicide film containing silicon and a metal (chromium, tantalum, molybdenum, titanium, hafnium, tungsten), a silicon film containing at least one of oxygen, nitrogen, and carbon, and a metal silicide film containing at least one of oxygen, nitrogen, and carbon.

A mask blank according to the present invention is useful when the resist film is a chemically amplified resist film. A mask blank according to the present invention is also particularly useful when a resist pattern is formed by subjecting this resist film to pattern exposure (lithography) with an electron beam accelerated at an acceleration voltage of 50 keV or more. This is because the invention of the present application is intended to further enhance the resolution of a chemically amplified resist pattern formed on a mask blank when 50 keV-compatible EB lithography is applied.

Examples of such a chemically amplified resist film in the present invention include a resist film that exhibits a resist property by a mechanism where an acid that is generated in the resist film by exposure and serves as a catalytic substance reacts with a functional group or a functional substance that controls the solubility of a polymer in the subsequent heat treatment step. Herein, "exhibits a resist property" refers to solubilization of such a polymer in an alkali in which the solubilization is achieved by, for example, removal of a functional group or the like.

A mask blank according to the present invention is particularly advantageous when the mask blank is used for forming a resist pattern having a linewidth of less than 100 nm on the mask blank. Examples of such a mask blank include an OPC mask and a mask having a mask enhancer structure (enhancer mask). In these masks (OPC masks and enhancer masks), auxiliary patterns formed around main patterns for the purpose of enhancing the resolution of the main patterns have the smallest widths. For this reason, a mask blank according to the present invention is particularly useful for manufacturing masks having such patterns.

A transfer mask and a method for manufacturing the transfer mask according to the present invention includes patterning the thin film of the mask blank according to the present invention to form a transfer pattern on the substrate (structure 7).

This transfer mask according to the present invention can satisfy the pattern accuracy required for transfer masks used for achieving a semiconductor design rule of a DRAM half pitch of 65 nm or less.

A mask blank according to the present invention includes a resist film on a substrate including a thin film, wherein an intermediate layer for preventing collapse of a resist pattern formed in the resist film exists between the thin film and the resist film (structure 8).

According to the invention of the structure 8, an intermediate layer for preventing collapse of a resist pattern formed in the resist film exists between the thin film and the resist film. As a result, collapse of a resist pattern can be prevented during a step of forming the resist pattern in the resist film and after the formation of the resist pattern.

In the invention according to the structure 8, a substrate including a thin film generally corresponds to a relatively solid ground. An intermediate layer for preventing collapse of a resist pattern corresponds to mat foundation for the ground and the resist pattern, and/or corresponds to a layer that is generally relatively soft and imparts a vibration-damping property and an earthquake-proof property to the resist pattern (a column-shaped structure). The intermediate layer is formed on the substrate. As a result, collapse of the resist pattern can be prevented during a step of forming the resist pattern in the resist film and after the formation of the resist pattern.

When a resist pattern formed in the resist film includes a pattern having a linewidth of less than 100 nm, the resist pattern tends to collapse during a step of forming the resist pattern in the resist film and after the formation of the resist pattern. However, the invention according to the structure 9 can prevent this collapse.

When a resist pattern formed in the resist film includes a pattern having an aspect ratio of 3 or more, the resist pattern (column-shaped structure) has low stability. For this reason, the resist pattern tends to collapse during a step of forming the resist pattern in the resist film and after the formation of the resist pattern. However, the invention according to the structure 10 can prevent this collapse.

The invention according to the structure 11 is a mask blank according to the present invention described above wherein the intermediate layer is insoluble in a developer for forming the resist pattern in the resist film.

The invention according to the structure 11 prevents the intermediate layer for preventing collapse of a resist pattern from being eroded by a developer. The intermediate layer corresponds to mat foundation for the ground and the resist pattern, and/or corresponds to a layer that is generally relatively soft and imparts a vibration-damping property and an earthquake-proof property to the resist pattern (a column-shaped structure). As a result, the occurrence of collapse of the resist pattern can be further reduced.

The invention according to the structure 12 is a mask blank according to the present invention described above wherein the intermediate layer is patterned when the thin film is being patterned with the resist pattern serving as a mask.

In the invention according to the structure 12, for example, the intermediate layer is patterned with an etchant that is used for patterning the thin film with the resist pattern serving as a mask. As a result, the process can be simplified and the resolution of a transfer pattern formed with the resist pattern serving as a mask is advantageously enhanced.

The invention according to the structure 13 is a mask blank according to the present invention described above wherein the intermediate layer is stripped off when the resist pattern is being stripped off from the substrate.

In the invention according to the structure 13, for example, the intermediate layer is stripped off with a stripper or by stripping means that is used for stripping off the resist pattern from the substrate. As a result, the process can be simplified.

A mask blank according to the present invention is particularly advantageous when the thin film is a film containing chromium or a film containing silicon (structure 14). Examples of materials for the film containing chromium or the film containing silicon include the materials described above.

The invention of a method for manufacturing a transfer mask according to the structure 15 includes preparing a mask blank including a thin film for forming a mask pattern, an intermediate layer for covering the thin film at least in a region where the mask pattern is formed, and a resist pattern formed on the intermediate layer; and sequentially patterning the intermediate layer and the thin film with the resist pattern serving as a mask.

In the invention according to the structure 15, an intermediate layer is formed to cover at least a region of the thin film for forming a mask pattern and the region is where the mask pattern is formed. As a result, for example, when the patterning is conducted with a solvent, collapse of the resist pattern can be effectively prevented.

The invention according to the structure 16 is a method for manufacturing a transfer mask according the present invention described above, wherein, after the intermediate layer and the thin film are patterned, the resist pattern and the intermediate layer are sequentially stripped off.

This invention is intended to remove the unnecessary layers for the transfer mask.

"Sequentially stripped off" includes the case where the resist pattern and the intermediate layer are simultaneously stripped off with the same stripper or by the same stripping means.

The features described in the structures 1 to 8 above can also be applied to the structures 9 to 16 above.

Examples of the substrate in the present invention include a synthetic quartz substrate, a soda lime glass substrate, a no-alkali glass substrate, and a low-thermal-expansion glass substrate.

Advantages

The present invention can provide a mask blank with which loss of a resist pattern and generation of a pattern defect can be prevented in manufacturing a transfer mask for achieving a semiconductor design rule (DRAM hp of 65 nm or less), and a mask.

BEST MODES FOR CARRYING OUT THE INVENTION

Hereinafter, an embodiment according to the present invention is described with reference to drawings.

FIG. 1 shows an example of a mask blank 10 according to a first embodiment of the present invention. In this example, the mask blank 10 is a mask blank for a binary mask and includes a transparent substrate 12, a light-shielding film 13 (laminated film constituted by a light-shielding layer 14 and an antireflective layer 16), an adhesion layer (intermediate layer) 18, and a chemically amplified resist film 20.

The transparent substrate 12 is, for example, a synthetic quartz substrate or composed of a material such as soda lime glass. The light-shielding film 13 is a laminated film constituted by the light-shielding layer 14 and the antireflective layer 16.

The light-shielding layer 14 includes, for example, a chromium nitride film 22 and a chromium carbonitride film 24 in ascending order on the transparent substrate 12. The chromium nitride film 22 is a layer mainly composed of chromium nitride (CrN) and has a film thickness of, for example, 10 to 20 nm. The chromium carbonitride film 24 is a layer mainly composed of chromium carbonitride (CrCN) and has a film thickness of, for example, 25 to 60 nm.

The antireflective layer 16 is, for example, a chromium film containing oxygen and nitrogen (CrON film) and is formed on the chromium carbonitride film 24. The antireflective layer 16 has a film thickness of, for example, 15 to 30 nm.

The light-shielding layer 14 and the antireflective layer 16 can be formed by reactive sputtering with chromium serving as a sputtering target in the atmosphere of a reactive gas (for example, oxygen gas, nitrogen gas, nitric oxide gas, carbon dioxide gas, hydrocarbon-based gas, or a mixed gas of the foregoing).

As described above, the light-shielding film 13 is constituted by materials of the chromium nitride film 22, the chromium carbonitride film 24, and the chromium oxynitride film from the transparent-substrate-12 side. Thus, by the presence of chromium and at least one element between oxygen and nitrogen in substantially the whole region of the light-shielding film 13 in the film thickness direction, or by mainly the presence of nitrogen in a large content for each layer, the dry etching rate of the light-shielding film 13 can be increased in dry etching with a chlorine-based gas.

Other examples of a material of the light-shielding film 13 include element chromium and a material (Cr-containing material) containing chromium and at least one element among oxygen, nitrogen, carbon, and hydrogen. The light-shielding film 13 can have a monolayer or a multilayer structure composed of the film material described above. When the light-shielding film 13 have a non-uniform composition, the light-shielding film 13 can have a multilayer structure that is formed stepwise or a film structure in which its composition varies continuously.

The light-shielding film 13 is preferably a thin film having an increased dry etching rate in view of size reduction of a transfer pattern and enhancement of the pattern accuracy. Specifically, an additional element for increasing the dry etching rate of the light-shielding film 13 is added to the whole region or substantially the whole region of the light-shielding film 13 in the film thickness direction. Examples of the additional element for increasing the dry etching rate include oxygen and/or nitrogen.

When the light-shielding film is a thin film containing chromium, the following materials can be selected as the materials of the light-shielding film.

When the chromium-containing thin film contains oxygen, the content of oxygen is preferably in the range of 5 to 80 atom %. When the content of oxygen is less than 5 atom %, the effect of increasing the dry etching rate is not sufficiently provided. When the content of oxygen is more than 80 atom %, the resultant film has a low absorption coefficient in terms of exposure light having a wavelength of 200 nm or less and being used for achieving a semiconductor design rule of a DRAM half pitch of 65 nm or less, such as ArF excimer laser (wavelength: 193 nm). For this reason, to obtain a desired optical density, an increase in the film thickness is required and hence enhancement of the pattern accuracy cannot be achieved. Thus, the content of oxygen more than 80 atom % is not preferable.

When the chromium-containing thin film contains nitrogen, the content of nitrogen is preferably in the range of 20 to 80 atom %. When the content of nitrogen is less than 20 atom %, the effect of increasing the dry etching rate is not sufficiently provided. When the content of nitrogen is more than 80 atom %, the resultant film has a low absorption coefficient in terms of exposure light having a wavelength of 200 nm or less and being used for achieving a semiconductor design rule of a DRAM half pitch of 65 nm or less, such as ArF excimer laser (wavelength: 193 nm). For this reason, to obtain a desired optical density, an increase in the film thickness is required and hence enhancement of the pattern accuracy cannot be achieved. Thus, the content of nitrogen more than 80 atom % is not preferable.

The chromium-containing thin film may contain both oxygen and nitrogen. In this case, the total content of oxygen and nitrogen is preferably in the range of 10 to 80 atom %. When the chromium-containing thin film contains both oxygen and nitrogen, the content ratio of the oxygen to the nitrogen is not particularly restricted and appropriately determined in consideration of conditions such as the absorption coefficient of the resultant film.

The chromium thin film containing oxygen and/or nitrogen may further contain an element or elements such as carbon, hydrogen, or helium.

In view of reducing the amount of oxygen in a dry etching gas, a dry etching gas containing no oxygen can also be used.

Chromium-based thin films are preferably etched (patterned) by dry etching in view of enhancing the pattern accuracy of the chromium-based thin films.

Chromium-based thin films are preferably dry etched with a dry etching gas composed of a chlorine-based gas or a mixed gas containing a chlorine-based gas and an oxygen gas. This is because, by dry etching chromium-based thin films composed of materials containing chromium and an element or elements such as oxygen or nitrogen with the dry etching gas described above, the dry etching rate of the films can be increased, the time for dry etching can be reduced, and a light-shielding film pattern having a good profile can be formed. Examples of the chlorine-based gas used as a dry etching gas include $Cl_2$, $SiCl_4$, $HCl$, $CCl_4$, and $CHCl_3$.

The adhesion layer 18 is intended to prevent loss of a resist pattern caused by insufficient adhesion of a resist film in a development treatment or in rinsing after the development treatment in a step of forming a patterned resist film and to prevent generation of a pattern defect. The adhesion layer 18 is formed on the light-shielding film 13.

The adhesion layer 18 is preferably resistant to a developer that is used for forming a resist pattern in the chemically amplified resist film 20. The adhesion layer 18 also preferably has a capability of being etched with an etchant that is used for etching the light-shielding film 13 with the resist pattern serving as a mask.

Specifically, the adhesion layer 18 may be a resin film composed of an organic material having a desired molecular weight (for example, an acrylic-based resin or the like).

The adhesion layer 18 preferably has a film thickness of 1 nm or more. The film thickness is preferably 2 nm or more and 25 nm or less, more preferably 2 nm or more and 20 nm or less, and still more preferably 5 nm or more and 15 nm or less. With such a film thickness, further enhancement can be certainly achieved in resolution of a resist formed on a mask blank and in resolution of a transfer pattern formed on a mask blank with a resist pattern serving as a mask. Specifically, a mask blank can be certainly provided that satisfy pattern accuracy required for a mask for forming micro patterns for a semiconductor design rule of a DRAM half pitch of 65 nm or less.

In a modification of the present embodiment, the mask blank 10 may be a mask blank for a phase-shifting mask. In this case, the mask blank 10 further includes a phase-shifting film, for example, between the transparent substrate 12 and the light-shielding film 13. Examples of the phase-shifting film include various known half-tone films such as chromium-based films (CrO, CrF, and the like), molybdenum-based films (MoSiON, MoSiN, MoSiO, and the like), tungsten-based films (WSiON, WSiN, WSiO, and the like), and silicon-based films (SiN, SiON, and the like). The mask blank 10 for a phase-shifting mask may also include a phase-shifting film on the light-shielding film 13.

FIG. 1(b) shows the chemically amplified resist film 20 that has been patterned by an exposure and development treatment. The light-shielding film 13 is patterned by etching the adhesion layer 18 and the light-shielding film 13 with the thus-patterned chemically amplified resist film 20 serving as a mask. Finally, the chemically amplified resist film 20 and the adhesion layer 18 are removed. Thus, a photomask is manufactured that has a light-shielding film pattern serving as a transfer pattern on the transparent substrate 12.

Hereinafter, Example according to the present invention and Comparative Example are described.

EXAMPLE 1

A synthetic quartz substrate of 6 inches per side and a thickness of 0.25 inches was used as the transparent substrate 12. The chromium nitride film 22 and the chromium carbonitride film 24 were formed as the light-shielding layer 14 by a sputtering method on the transparent substrate 12. After that, a chromium oxynitride film was formed as the antireflective layer 16. The light-shielding film 13 contained nitrogen in substantially the whole region of the light-shielding film 13 in the film thickness direction. The light-shielding film 13 had a thickness of 68 nm.

The adhesion layer 18 was subsequently formed by spin-coating an adhesion layer (FKB-15B manufactured by FUJI-FILM Electronic Materials Co., Ltd.) to a thickness of 30 nm. After that, the adhesion layer 18 was dried by a heat treatment at 200° C. for 10 minutes with a hot plate. Before a resist is coated, contaminants such as organic matter adhering to the surface of the adhesion layer 18 were removed and cleaned by heat treating the adhesion layer 18 at 200° C. The chemically amplified resist film 20 was subsequently coated by spin-coating a chemically amplified positive resist for electron beam exposure (FEP171 manufactured by FUJIFILM Electronic Materials Co., Ltd.) to a thickness of 300 nm. After that, the chemically amplified resist film 20 was dried by being heat treated at 130° C. for 10 minutes with a hot plate. Thus, the mask blank 10 was obtained that was a photomask blank including a resist film for exposure to ArF excimer laser.

COMPARATIVE EXAMPLE 1

A mask blank according to Comparative Example 1 was obtained as in Example 1 except that the adhesion layer 18 was not formed.

To compare the mask blanks according to Example 1 and Comparative Example 1 in terms of resolution, a resist pattern was each formed and the light-shielding film was patterned with the resist pattern serving as a mask. Each mask blank was first exposed with an electron beam exposure system and subsequently subjected to a post-exposure baking treatment and a development treatment. Thus, each resist pattern was formed. This exposure was conducted with an electron beam accelerated at an acceleration voltage of 50 keV or more. The resist patterns formed were 80 nm line and space patterns.

The formed resist patterns were inspected. For Example 1, the adhesion layer 18 provided good adhesion between the chemically amplified resist film 20 and the light-shielding film 13 and, as a result, appropriate formation of the 80 nm line and space pattern was confirmed.

In contrast, for Comparative Example 1, the adhesion between the chemically amplified resist film 20 and the light-shielding film 13 was insufficient and hence the resist pattern was lost in a rinsing treatment after the development treatment.

Subsequently, the adhesion layer 18 and the light-shielding film 13 were patterned by dry etching with an etching gas containing a chlorine gas and an oxygen gas with the resist pattern serving as a mask. Finally, the chemically amplified resist film 20 and the adhesion layer 18 were removed. Thus, a mask for exposure to ArF excimer laser was manufactured.

For Example 1, an 80 nm line and space light-shielding-film pattern was formed in the light-shielding film and no footing projections were generated at the foot portions of the light-shielding-film pattern. The pattern accuracy satisfied the linearity of 10 nm or less for a semiconductor design rule of a DRAM half pitch of 65 nm.

In contrast, for Comparative Example 1, the presence of pattern defects was confirmed that were caused by the loss of the resist pattern in the rinsing treatment after the development treatment. Also, generation of footing projections was confirmed at the foot portions of the formed light-shielding-film pattern. An 80 nm line and space pattern was not formed and only a 200 nm line and space pattern was resolved.

FIG. 2 shows an example of the mask blank 10 according to a second embodiment of the present invention.

Except for the features described below, the same or similar features in FIG. 1 are designated with identical reference numerals in FIG. 2 and are not described. In this example, the mask blank 10 includes the transparent substrate 12, the light-shielding film 13 (laminated film constituted by the light-shielding layer 14 and the antireflective layer 16), a silicon-containing film 32 (a film containing silicon), an adhesion layer (intermediate layer) 34 composed of a resin (organic) material, and the chemically amplified resist film 20.

The silicon-containing film 32 is a film that contains silicon and serves as a hard mask in patterning the light-shielding film 13. The silicon-containing film 32 is formed on the light-shielding film 13. The silicon-containing film 32 has a film thickness of, for example, 30 nm (for example, 25 to 35 nm). The silicon-containing film 32 may be a MoSi-containing film composed of MoSiO, MoSiN, MoSiON, or the like. Alternatively, the silicon-containing film 32 may be a film composed of TaSiO, TaSiN, TaSiON, TaBO, TaBN, TaBON, WSiO, WSiN, WSiON, SiO, SiN, SiON, or the like. The silicon-containing film 32 used as a hard mask is an example of a thin film for forming a transfer pattern.

The adhesion layer 34 is intended to prevent loss of a resist pattern caused by insufficient adhesion of a resist film in a development treatment or in rinsing after the development treatment in a step of forming a patterned resist film and to prevent generation of a pattern defect. The adhesion layer 34 is a layer (a resin film composed of an organic material) for improving the adhesion between the silicon-containing film 32 and the chemically amplified resist film 20. The adhesion layer 34 is formed on the silicon-containing film 32. The adhesion of the adhesion layer 34 composed of a resin (organic) material to the silicon-containing film 32 is higher than the adhesion of the chemically amplified resist film 20 to the silicon-containing film 32 when the chemically amplified resist film 20 is formed on the silicon-containing film 32.

In the present example, for example, the adhesion layer 34 preferably has a film thickness of 1 nm or more. The film thickness is preferably 2 nm or more and 25 nm or less, more preferably 2 nm or more and 20 nm or less, and still more preferably 5 nm or more and 15 nm or less. The chemically amplified resist film 20 is generally formed on the adhesion layer 34 in a mask blank.

FIG. 2(b) shows the chemically amplified resist film 20 that has been patterned by electron beam lithography. The adhesion layer 34 and the silicon-containing film 32 are etched with the thus-patterned chemically amplified resist film 20 serving as a mask. The light-shielding film 13 is etched with the silicon-containing film 32 serving as a mask (hard mask). Thus, a photomask is manufactured that has the patterned light-shielding film 13.

Hereinafter, Example according to the second embodiment of the present invention and Comparative Example are described.

EXAMPLE 2

The light-shielding film 13 was formed as in Example 1 with the transparent substrate 12 as in Example 1. A MoSiON film was further formed as the silicon-containing film 32. The silicon-containing film 32 had a thickness of 30 nm.

The adhesion layer 34 was subsequently formed by spin-coating a resin film composed of the same organic material as in Example 1 (FKB-15B manufactured by FUJIFILM Electronic Materials Co., Ltd.) to a thickness of 30 nm. After that, the adhesion layer 34 was dried by a heat treatment at 200° C. for 10 minutes with a hot plate. The chemically amplified resist film 20 was subsequently formed as in Example 1. Thus, the mask blank 10 was obtained that was a photomask blank including a resist film.

COMPARATIVE EXAMPLE 2

A mask blank according to Comparatives Example 2 was obtained as in Example 2 except that the adhesion layer 34 was not formed.

To compare the mask blanks according to Example 2 and Comparative Example 2 in terms of the adhesion between the chemically amplified resist film and the silicon-containing film, each chemically amplified resist film was patterned. Each mask blank was exposed with an electron beam exposure system and subsequently subjected to a post-exposure baking treatment and a development treatment. Thus, each resist pattern was formed. This exposure was conducted with an electron beam accelerated at an acceleration voltage of 50 keV or more. The resist patterns formed were 80 nm line and space patterns.

The formed resist patterns were inspected. For Example 2, the adhesion layer 34 provided good adhesion between the chemically amplified resist film 20 and the silicon-containing film 32 and, as a result, appropriate formation of the 80 nm line and space pattern was confirmed.

In contrast, for Comparative Example 2, the adhesion between the chemically amplified resist film and the silicon-containing film was insufficient and hence the resist pattern was lost in a rinsing treatment after the development treatment.

Subsequently, the adhesion layer 34 and the silicon-containing film 32 were patterned by dry etching with an etching gas containing a fluorine-based gas with the resist pattern serving as a mask. Further, the light-shielding film 13 was patterned by dry etching with an etching gas containing a chlorine gas and an oxygen gas with the patterned silicon-containing film 32 serving as a mask. Finally, the chemically amplified resist film 20, the adhesion layer 34, and the silicon-containing film 32 were removed. Thus, a mask for exposure to ArF excimer laser was manufactured.

For Example 2, an 80 nm line and space light-shielding-film pattern was formed in the light-shielding film and no footing projections were generated at the foot portions of the light-shielding-film pattern. The pattern accuracy satisfied the linearity of 10 nm or less for a semiconductor design rule of a DRAM half pitch of 65 nm.

In contrast, for Comparative Example 2, the presence of pattern defects was confirmed that were caused by the loss of the resist pattern in the rinsing treatment after the development treatment. Also, generation of footing projections was confirmed at the foot portions of the formed light-shielding-film pattern. An 80 nm line and space pattern was not formed and only a 200 nm line and space pattern was resolved.

In Examples 1 and 2 described above, examples were described in which the adhesion layers 18 and 34 were respectively removed with the gas for etching the light-shielding film 13 and the gas for etching the silicon-containing film 32. However, removal of the adhesion layers 18 and 34 is not restricted thereto. Alternatively, after the resist patterns are formed, only the adhesion layers 18 and 34 may be removed by ashing or the like, and the light-shielding films 13 and the silicon-containing films 32 may be patterned by etching with the patterns constituted by the adhesion layers and the resist films serving as masks.

While the present invention has been described with reference to embodiments thereof, the technical scope of the present invention is not restricted to the scope described in the embodiments above. It will be apparent to those skilled in the art that various changes and modifications can be made in the above-described embodiments. According to the description of CLAIMS, such modifications and variations are obviously to be embraced within the technical scope of the present invention.

BRIEF DESCRIPTION OF DRAWINGS

FIG. 1(a) shows an example of the configuration of the mask blank 10. FIG.

1(b) shows a chemically amplified resist film 20 that has been patterned by an exposure and development treatment.

Figure 1:
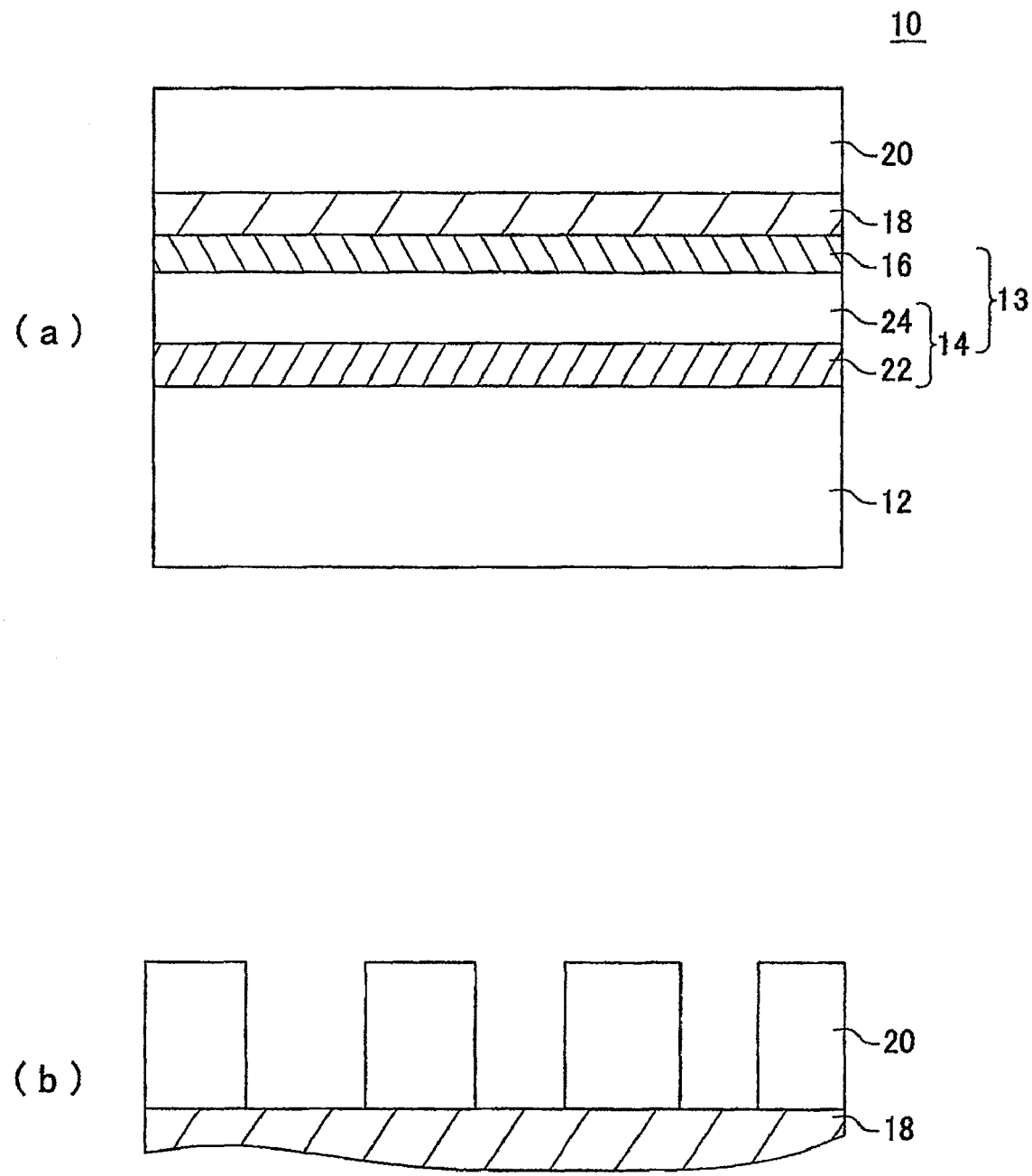
FIG. 1 shows an example of a mask blank 10 according to a first embodiment of the present invention.
Figure 2:
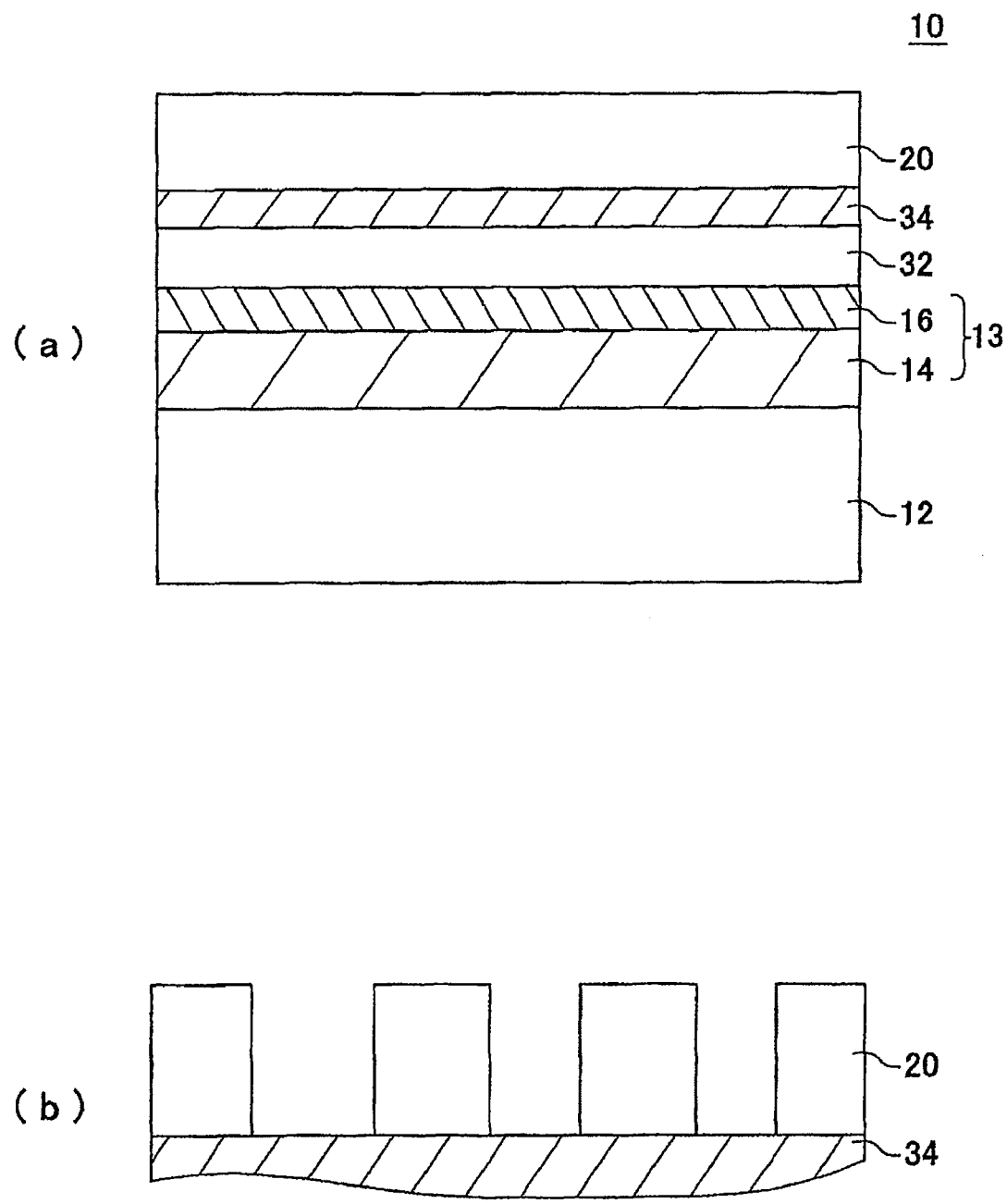

FIG. 2 shows an example of the mask blank 10 according to a second embodiment of the present invention. FIG. 2(a) shows an example of the configuration of the mask blank 10. FIG. 2(b) shows the chemically amplified resist film 20 that has been patterned by electron beam lithography.

REFERENCE NUMERALS 10 mask blank
12 transparent substrate
13 light-shielding film
14 light-shielding layer
16 antireflective layer
18 adhesion layer
20 chemically amplified resist film
22 chromium nitride film
24 chromium carbonitride film
32 silicon-containing film
34 adhesion layer

The invention claimed is:

1. A mask blank, comprising:
a substrate,
a thin film for forming a mask pattern, the thin film being formed on the substrate,
a resist film formed over the thin film, and
an adhesion layer that is bonded to the thin film and the resist film,
wherein the adhesion layer is a resin film resistant to a developer that is used in development,
wherein the adhesion layer has a film thickness of 1 nm or more and 30 nm or less.

2. The mask blank according to claim 1, wherein a surface of the adhesion layer is cleaned, the surface being on a side where the resist film is formed.

3. The mask blank according to claim 1, wherein the adhesion layer is removed by a patterning treatment for the thin film.

4. The mask blank according to claim 1, wherein the thin film is a metal film.

5. The mask blank according to claim 1, wherein the thin film is a silicon-containing film that contains silicon.

6. A method for producing a transfer mask comprising patterning the thin film of the mask blank according to claim 1 to form a transfer pattern on the substrate.

7. The mask blank according to claim 1, wherein the resist pattern formed in the resist film includes a pattern having an aspect ratio of 3 or more.

8. The mask blank according to claim 1, wherein the adhesion layer is made of an organic material that is etchable with an etchant that is used for etching the thin film.

9. The mask blank according to claim 1, wherein the resist pattern formed in the resist film includes a pattern having a linewidth of less than 100 nm.

10. The mask blank according to claim 1, wherein the adhesion layer is made of an acrylic-based resin.

11. A mask blank, comprising:
a substrate,
a thin film formed on the substrate,
a resist film formed over the thin film, and
an intermediate layer formed between the thin film and the resist film, the intermediate layer preventing collapse of a resist pattern formed in the resist film,
wherein the intermediate layer is made of a resin film that is insoluble in a developer for forming the resist pattern in the resist film,
wherein the intermediate layer has a film thickness of 1 nm or more and 30 nm or less.

12. The mask blank according to claim 11, wherein the resist pattern formed in the resist film includes a pattern having a linewidth of less than 100 nm.

13. The mask blank according to claim 11, wherein the resist pattern formed in the resist film includes a pattern having an aspect ratio of 3 or more.

14. The mask blank according to claim 11,
wherein the intermediate layer is patterned when the thin film is patterned with the resist pattern serving as a mask.

15. The mask blank according to claim 11,
wherein the intermediate layer is stripped off when the resist pattern is stripped off from the substrate.

16. The mask blank according to claim 11,
wherein the thin film is a film containing chromium or a film containing silicon.

17. The mask blank according to claim 11, wherein the intermediate layer is made of an acrylic-based resin.

18. A method for producing a transfer mask, comprising:
preparing a mask blank including a thin film for forming a mask pattern, an intermediate layer for covering the thin film at least in a region where the mask pattern is formed, and a resist pattern formed on the intermediate layer; and
sequentially patterning the intermediate layer and the thin film with the resist pattern serving as a mask,
wherein the intermediate layer is made of a resin film that is insoluble in a developer for forming the resist pattern in the resist film,
wherein the intermediate layer has a film thickness of 1 nm or more and 30 nm or less.

19. The method for producing a transfer mask according to claim 18,
wherein, after the intermediate layer and the thin film are patterned, the resist pattern and the intermediate layer are sequentially stripped off.

* * * * *